(12) United States Patent
Shoji

(10) Patent No.: US 8,513,823 B2
(45) Date of Patent: Aug. 20, 2013

(54) SEMICONDUCTOR PACKAGE HAVING MAIN STAMP AND SUB-STAMP

(75) Inventor: Hiroyuki Shoji, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/172,328

(22) Filed: Jun. 29, 2011

(65) Prior Publication Data

US 2012/0032357 A1    Feb. 9, 2012

(30) Foreign Application Priority Data

Aug. 5, 2010  (JP) .................. 2010-176052

(51) Int. Cl.
*H01L 23/544* (2006.01)
*H01L 21/78* (2006.01)

(52) U.S. Cl.
USPC ............ 257/797; 257/E23.179; 257/E21.599; 257/E23.114; 257/E21.511; 257/758; 257/739; 257/678; 257/687

(58) Field of Classification Search
USPC ............... 257/797, E23.179, E21.599, 758, 257/E23.114, 739, E21.511, 678, 687
See application file for complete search history.

(56) References Cited

U.S. PATENT DOCUMENTS

| | | | |
|---|---|---|---|
| 6,777,250 B1 | 8/2004 | Nakajyo et al. | |
| 7,279,792 B2 | 10/2007 | Naya | |
| 8,069,782 B2 * | 12/2011 | Fragala et al. ................. | 101/28 |
| 2004/0235271 A1 | 11/2004 | Nakajyo et al. | |
| 2010/0178722 A1 * | 7/2010 | de Graff et al. ................. | 438/65 |
| 2012/0052415 A1 * | 3/2012 | Fragala et al. ................. | 430/2 |

FOREIGN PATENT DOCUMENTS

| | | |
|---|---|---|
| JP | 5-267482 | 10/1993 |
| JP | 2002-026045 | 1/2002 |
| JP | 2005-203695 | 7/2005 |
| JP | 2007-048989 | 2/2007 |

\* cited by examiner

*Primary Examiner* — A O Williams
(74) *Attorney, Agent, or Firm* — Young & Thompson

(57) ABSTRACT

In a semiconductor package, a stamp is provided on at least one of at least a pair of opposed sides on an outer peripheral portion in contact with an edge of the package, which is a blank space up to now. With this configuration, the amount of stamp can be increased even in a narrow stamp area.

4 Claims, 9 Drawing Sheets

FIG. 6A
FORMING SOLDER BUMPS
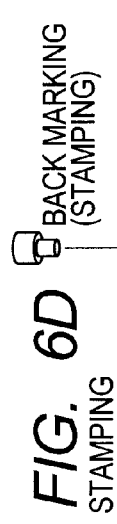
FIG. 6B
ATTACHING BG TAPE
FIG. 6C
BG (BACK GRINDING)
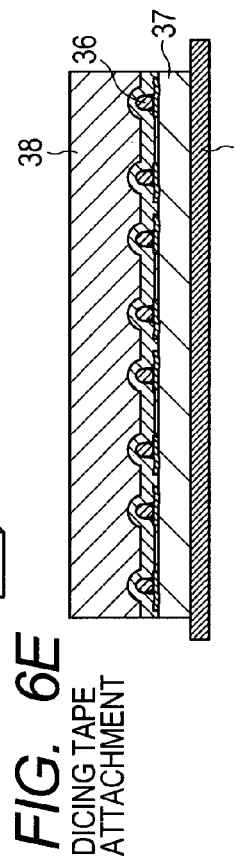
FIG. 6D
STAMPING
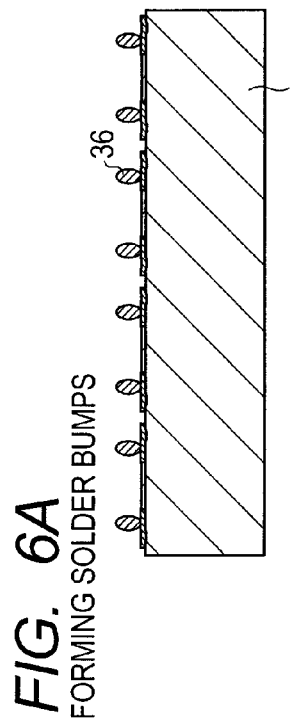
FIG. 6E
DICING TAPE ATTACHMENT
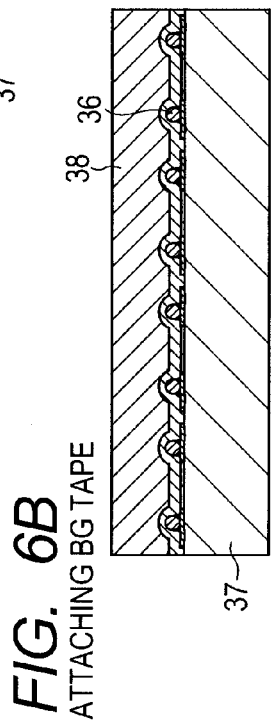
FIG. 6F
PEELING OFF BG TAPE
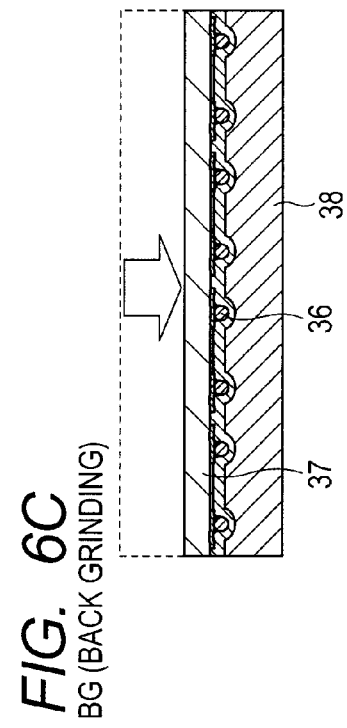
FIG. 6G
DICING
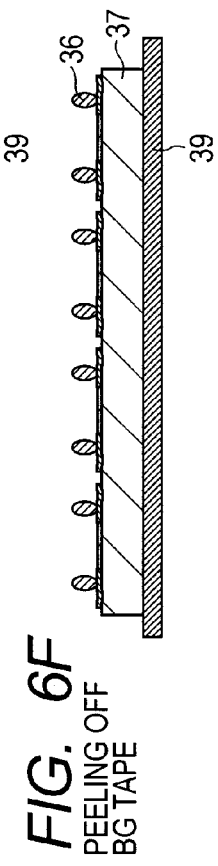
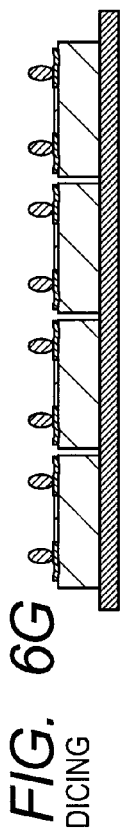

RELATED ART

STAMP OUT OF ALIGNMENT
(STAMP EXAMPLE: "SEE8")

STAMP IN NORMAL POSITION
(STAMP EXAMPLE: "SEE8")

STAMP AREA

STAMP OUT OF ALIGNMENT
(STAMP EXAMPLE: "SEE8")

*RELATED ART*

RELATED ART

SEMICONDUCTOR PACKAGE HAVING MAIN STAMP AND SUB-STAMP

CROSS-REFERENCE TO RELATED APPLICATIONS

The disclosure of Japanese Unexamined Patent Application Publication No. 2010-176052 filed on Aug. 5, 2010 including the specification, drawings and abstract is incorporated herein by reference in its entirety.

BACKGROUND

The present invention relates to a semiconductor package in which after respective stamps are put in block, singulation is conducted by dicing, and a method of manufacturing the semiconductor package.

In recent years, portable information communication devices including cellular phones are commercialized in very short development cycles such that new products are released several times a year for the purpose of increasing multiple functions or downsizing the device. With this short development cycles, a demand to downsize the semiconductor package mounted in the portable information communication device goes on increasing.

One of ultimately downsized semiconductor packages is a wafer level semiconductor package represented by a wafer level chip size package. In a process of assembling the package, after the wafer is stamped in block, the wafer is divided and singulated into respective packages.

For example, Japanese Unexamined Patent Application Publication No. 2002-26045 discloses the invention pertained to a wafer level semiconductor package in which after a rear surface of the wafer has been stamped for each chip, the wafer is divided by dicing into the respective chips, and then assembled, and a method of stamping the package.

FIGS. 7A to 7E are diagrams of a process of manufacturing a wafer level semiconductor package according to Japanese Unexamined Patent Application Publication No. 2002-26045.

In a wafer level semiconductor package in which a Cu post terminal side is sealed with a resin as illustrated in FIG. 7A, position information 2 is stamped on a wafer surface opposite to a terminal surface 3 as illustrated in FIG. 7B. Then, as illustrated in FIG. 7C, probe pins 5 are brought into contact with the respective terminals 4 to conduct an electric test on the respective chips at the wafer level. Thereafter, as illustrated in FIG. 7D, results of the electric test are stamped in the respective chip region of the wafer rear surface. Finally, as illustrated in FIG. 7E, the wafer is diced into the respective chips by a dicing saw to produce individual semiconductor packages.

On the other hand, Japanese Unexamined Patent Application Publication No. Hei05(1993)-267482 discloses the invention in which multiple bar code marks are stamped on an upper surface of the package.

FIG. 10 illustrates a semiconductor device according to Japanese Unexamined Patent Application Publication No. Hei05(1993)-267482.

In the semiconductor package illustrated in FIG. 10, bar code marks 17 and 18 are provided on multiple portions 19 and 20 of a package 15, spaced from each other, and read by a bar code reader as positioning references for mounting, thereby enabling positioning for mounting.

The stamp information is roughly classified into indication used for confirming a product name on a client side, and a lot management traceability indication for a semiconductor manufacturer. The latter indication is intended for the internal management, and therefore may be thus stamped with the bar codes.

SUMMARY

FIGS. 8A to 8D and 9 are illustrative diagrams showing a problem is occurred with a stamp position according to the related art.

In the process illustrated in FIGS. 7A to 7E, if stamp positions are misaligned, the wafer is so diced as to divide stamp characters as illustrated in FIG. 8D. As a result, in each of the divided chip pieces, the stamp is partially out of alignment to the external of each package, and the stamp information in a portion scraped off by dicing is lost.

For that reason, in order to prevent the offset of the stamp due to the stamp misalignment, a blank space 7 in which no stamp is conducted is provided in an outer peripheral portion of the package as illustrated in FIG. 8C. The blank space is generally 0.1 mm or more on one side, taking the stamp position precision and the dicing precision into consideration.

When characters such as alphanumeric characters are stamped, as illustrated in FIG. 9, a character height 10 is 0.3 mm or more, a character width 8 is 0.15 mm or more, and a character interval 9 is 0.05 mm or more from the viewpoints of blur or visibility of the characters. Accordingly, the downsized package of, for example, 10×0.5 mm allows stamps of only three characters, and the other outer peripheral portions 11 and 12 are the blank spaces.

As described above, in the related art, as illustrated in FIG. 8C, the blank spaces in which no stamp is conducted are provided in the outer peripheral portion of the package. For that reason, the related art suffers from such a problem that in the downsized package of 1×0.5 mm, the product name of four or more characters cannot be stamped in a stampable area, and the lot management information for quality traceability cannot be stamped.

On the other hand, as described above, the characters can be replaced with the bar codes. However, the downsized package of 1.0×0.5 mm suffers from such a problem that the amount of information indicated by the stamp is decreased as described below.

Even if stamp is conducted by a laser available for fine stamp, as illustrated in FIG. 9, a width of the bar code is 0.05 mm or more. Therefore, even if the bar code is stamped without reducing one character from the product name to be stamped, only three or four bars can be stamped, and information more than 16 kinds at the maximum cannot be identified.

On the contrary, the alphanumeric character stamp can identify 36 kinds of information by one character with the use of alphabets and numerals. Therefore, there arises such a problem that even if the bar code is stamped instead of the characters, identifiable information is reduced.

According to the present invention, there is provided a semiconductor package in which a character stamp such as information on product name is provided in the center of a stamp surface, and a stamp arranged in contact with or across a dicing line, which is the blank space in the related art, is provided in an outer peripheral portion of the stamp surface, for the purpose of lot management traceability indication.

The stamps having the same shape are provided on opposed sides in the outer peripheral portion, or the stamp is provided on only any one side. Therefore, even if the stamp or dicing is misaligned, the stamp is provided on at least any one of the opposed sides so that the stamp can be identified.

With the above configuration, the stamp on the outer peripheral portion of the stamp surface, which is the blank space in the related art, can be also identified. Even in the downsized package of, for example, 1.0×0.5 mm, stamp of the product name of three characters as well as additional stamp of the lot management information for quality traceability can be provided.

BRIEF DESCRIPTION OF THE DRAWINGS

FIGS. 6A to 6G are diagrams of a process of manufacturing a wafer level semiconductor package in the present invention;

DETAILED DESCRIPTION

The present inventors have earnestly studied a semiconductor device that is nonproblematic even if misalignment occurs, and can respond to a downsized package, taking a stamp position precision as well as a dicing position precision into consideration. In particular, the present inventors have paid to attention to a fact that a blank space region in a stamp area is also stamped, and studied a stamping method for the semiconductor device many times.

As a result, the present inventors have found a semiconductor device that is excellent in a stamp position precision as well as a dicing position precision, and nonproblematic even if misalignment occurs, and a method of manufacturing the semiconductor device, and come to complete the present invention.

Hereinafter, embodiments of the present invention will be described with reference to the accompanying drawings. For clarification of description, the following description and drawings are appropriately omitted or simplified. In the respective drawings, components having the identical configurations or functions, and corresponding portions are denoted by identical symbols, and their description will be omitted.

FIGS. 1A, 1B to 5A, 5B are illustrative top views when a wafer level semiconductor device is singulated through a dicing process according to first to fifth embodiments of the present invention.

FIGS. 1A, 2A, 3A, 4A, and 5A illustrate examples in which a stamp position is normal, and FIGS. 1B, 2B, 3B, 4B, and 5B illustrate state examples in which a stamp is misaligned.

Also, FIG. 6 illustrates an example of a process of manufacturing a wafer level semiconductor package according to the present invention, common to first to fifth embodiments of the present invention, which will be described below.

First, as illustrated in FIG. 6A, solder bumps 36 are formed on a circuit surface of a wafer 37.

Then, as illustrated in FIG. 6B, a BG (back grinding) tape 38 is attached onto the circuit and bump surface. Thereafter, as illustrated in FIG. 6C, a wafer back surface (surface opposite to the circuit surface) is ground in a state where the wafer 37 is held by the tape 38.

Then, as illustrated in FIG. 6D, a circuit pattern is recognized by image, and positioned through the semitransparent BG tape 38, and the ground back surface is stamped.

Then, as illustrated in FIG. 6E, a stamp surface of the wafer 37 is attached onto a dicing tape 39. Thereafter, as illustrated in FIG. 6F, the BG tape 38 is peeled off.

Finally, the package is singulated by dicing as illustrated in FIG. 6E.

First Embodiment

Figure 1A:
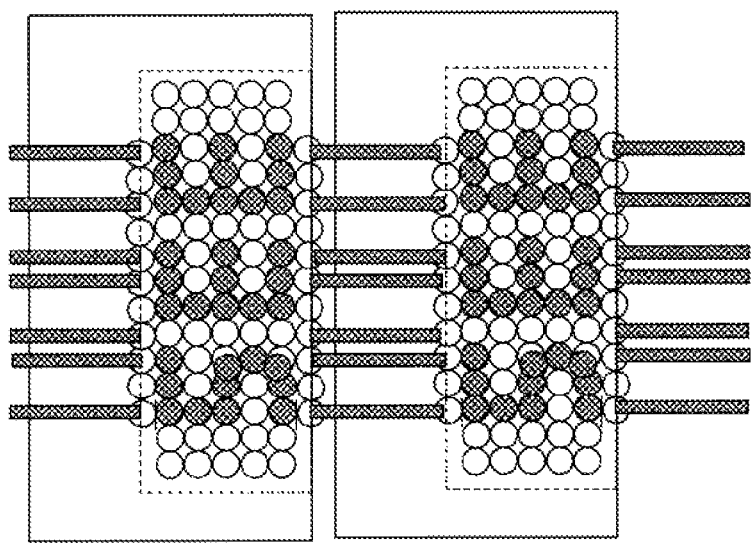
FIGS. 1A and 1B are top views of a wafer level semiconductor package according to a first embodiment of the present invention.
Figure 1B:
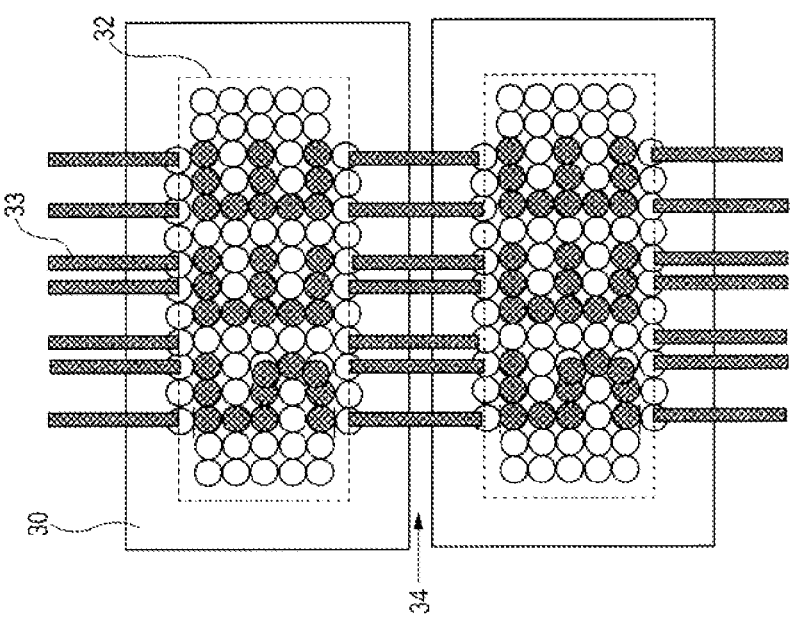

FIGS. 1A and 1B illustrate top views of a downsized wafer level semiconductor device of 1.0×0.5 mm according to a first embodiment of the present invention. As illustrated in FIGS. 1A and 1B, in addition to a main stamp such as a produce name of three characters stamped in a main stamp space 32 in the center of a package, an outer peripheral portion 30, which is a blank space in the related art, is also stamped as a sub-stamp 33. In other words, the package has a stamp that includes the main stamp stamped in the main stamp space 32 and the sub-stamp stamped in the outer peripheral portion 30.

The sub-stamp 33 provided on the outer peripheral portion 30 is formed of a geometric-configured pattern such as a bar code pattern, and extends across a dicing line 34, and the same sub-stamp 33 is provided on both of opposed sides of the package.

In FIGS. 1A and 1B, the sub-stamp 33 is provided on only upper and lower opposed sides of the package. It is not limited to above, the sub-stamp 33 may be provided on right and left opposed sides of the package.

FIG. 1A is a diagram illustrating a state in which there the stamp is not misaligned. In this case, as illustrated in FIG. 1A, the same bar code pattern as sub-stamp 33 is stamped on the upper and lower outer peripheral portions 30 of the main stamp space 32. Therefore, the sub-stamps 33 on the upper and lower outer peripheral portions 30 are extended to an edge of the package.

FIG. 1B is an illustrative diagram when the stamp is misaligned in a vertical direction of the drawing.

As illustrated in FIG. 1B, after the wafer is singulated by dicing, there is no sub-stamp 33 on the outer peripheral portion 30 on a lower side of the main stamp space 32 due to the stamp misalignment. However, there is the sub-stamp 33 on an upper side of the main stamp space 32 instead. In this case, at least one of the sub-stamps 33 on the upper and lower outer peripheral portions 30 is extended to an edge of the package.

In this way, because the sub-stamp 33 appears on the outer peripheral portion 30 on at least one of the opposed sides of the package even if the stamp is misaligned, the sub-stamp 33 on the outer peripheral portion 30 can be identified even if the stamp is misaligned.

Second Embodiment

Figure 2A:
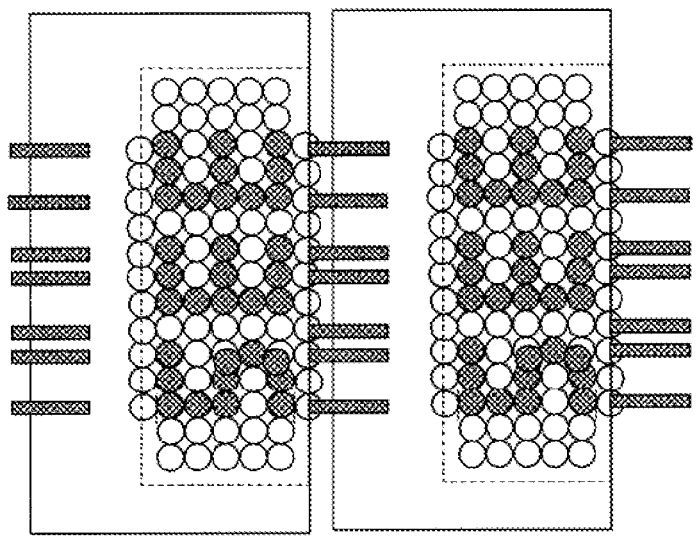
FIGS. 2A and 2B are top views of a wafer level semiconductor package according to a second embodiment of the present invention.
Figure 2B:
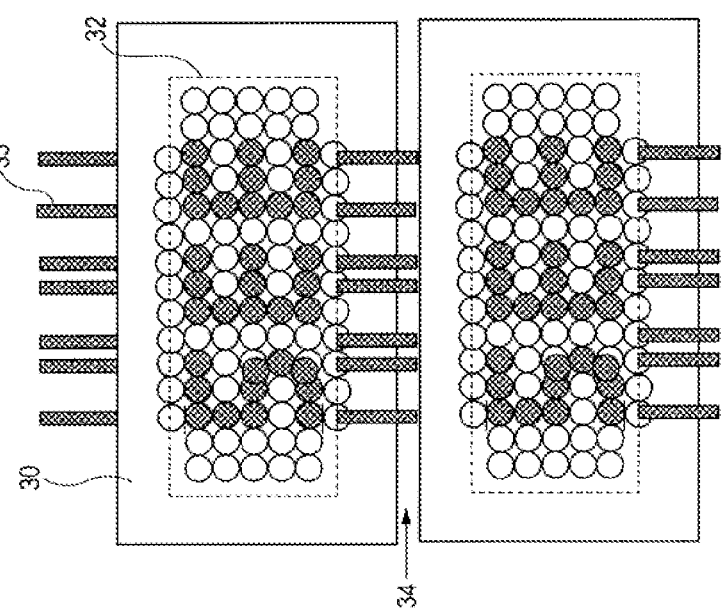

FIGS. 2A and 2B are top views of a downsized wafer level semiconductor device of 1.0×0.5 mm according to a second embodiment of the present invention. As illustrated in FIGS.

2A and 2B, in addition to a main stamp such as a produce name of three characters stamped in the main stamp space 32, the outer peripheral portion 30, which is the blank space in the related art, is also stamped as a sub-stamp 33.

The sub-stamp 33 provided on the outer peripheral portion 30 is formed of a geometric-configured pattern such as a bar code pattern, and extends up to the dicing line 34. Thus, the sub-stamp 33 is provided on one of the opposed sides of the package.

In FIGS. 2A and 2B, the sub-stamps 33 are provided on only the opposed sides in the vertical direction. It is not limited to above, the same sub-stamps 33 may be provided on opposed sides of the package in a horizontal direction.

FIG. 2A is a diagram illustrating a state in which the stamp is not misaligned. In this case, as illustrated in FIG. 2A, the sub-stamp 33 is stamped on only the outer peripheral portion 30 on the lower side of the main stamp space 32. In this case, the sub-stamp 33 on the lower outer peripheral portions 30 is extended to an edge of the package.

FIG. 2B is an illustrative diagram when the stamp is misaligned in a vertical direction. As illustrated in FIG. 2B, after the wafer is singulated by dicing, the sub-stamp 33 on the outer peripheral portion 30 on a lower side of the main stamp space 32 may be lost due to the stamp misalignment. However, another sub-stamp 33 located at upper side appears on an upper side of the main stamp space 32 instead. In this case, the sub-stamp 33 on the upper outer peripheral portions 30 is extended to an edge of the package.

In this way, because the sub-stamp 33 appears on the outer peripheral portion 30 on at least one of the opposed sides of the package even if the stamp is misaligned, the sub-stamp 33 on the outer peripheral portion 30 can be identified even if the stamp is misaligned.

Third Embodiment

Figure 3A:
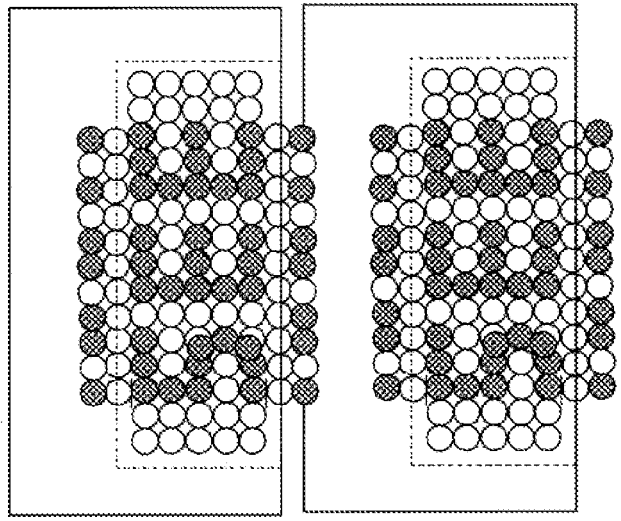
FIGS. 3A and 3B are top views of a wafer level semiconductor package according to a third embodiment of the present invention.
Figure 3B:
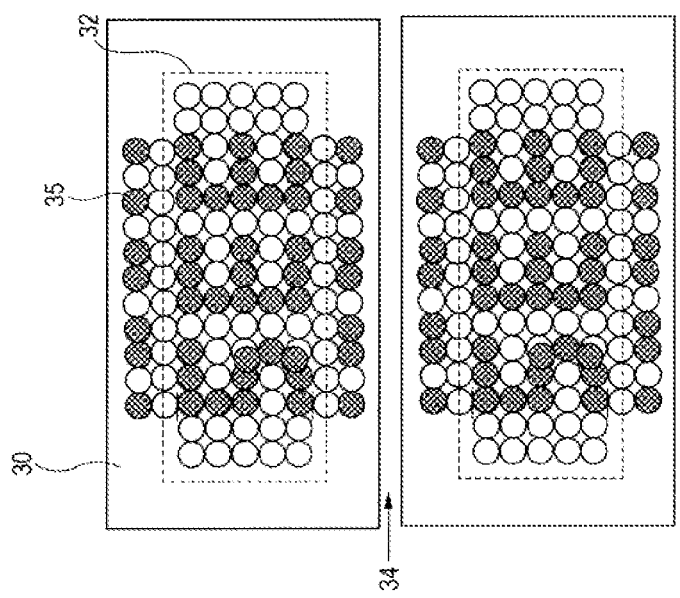

FIGS. 3A and 3B are top views of a downsized wafer level semiconductor device of 1.0×0.5 mm according to a third embodiment of the present invention. As illustrated in FIGS. 3A and 3B, in addition to a main stamp such as a produce name of three characters stamped in the main stamp space 32, the outer peripheral portion 30, which is the blank space in the related art, is also stamped as a sub-stamp 35.

The sub-stamp 35 provided on the outer peripheral portion 30 is formed by a geometric-configured pattern such as a dot array pattern, and the sub-stamps 35 of the same dot array pattern are provided on both of the opposed sides of the package on a line.

In FIGS. 3A and 3B, the sub-stamps 35 are provided on only the opposed sides of the package in the vertical direction. It is not limited to above, the same sub-stamps 35 may be provided on opposed sides of the package in the horizontal direction.

FIG. 3A is a diagram illustrating a state in which the stamp is not misaligned. In this case, as illustrated in FIG. 3A, the sub-stamps 35 of the same dot array pattern are stamped on the outer peripheral portion 30 on the upper and lower sides of the main stamp space 32.

FIG. 3B is an illustrative diagram when the stamp is misaligned in the vertical direction. As illustrated in FIG. 3B, after the wafer is singulated by dicing, the sub-stamp 35 of the dot array pattern on the lower side of the main stamp space 32 may be lost due to the stamp misalignment. However, the sub-stamp 35 of the dot array pattern appears on an upper side of the main stamp space 32 instead.

In this way, because the sub-stamp 35 appears on the outer peripheral portion 30 on at least one of the opposed sides of the package even if the stamp is misaligned, the sub-stamp 35 on the outer peripheral portion 30 can be identified even if the stamp is misaligned.

Fourth Embodiment

Figure 4B:
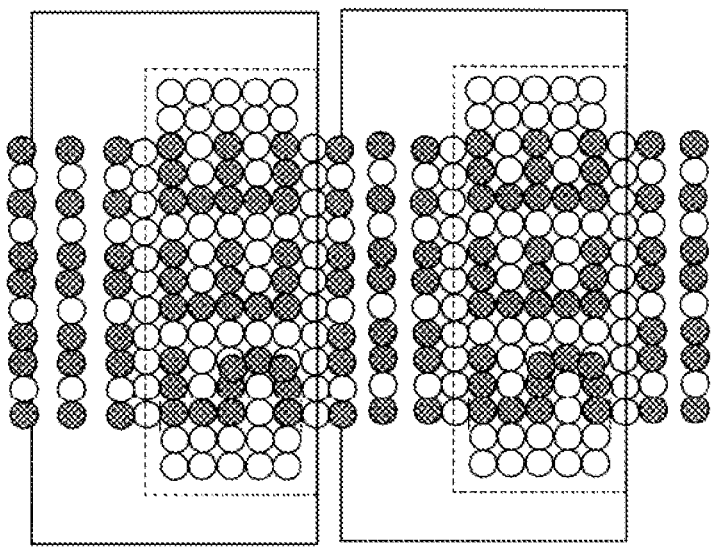
FIGS. 4A and 4B are top views of a wafer level semiconductor package according to a fourth embodiment of the present invention.
Figure 4A:
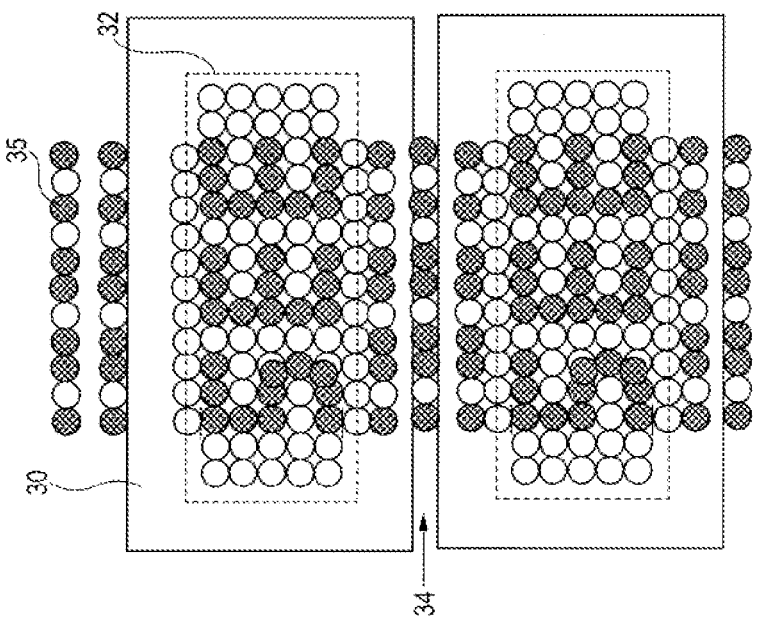

FIGS. 4A and 4B are top views of a downsized wafer level semiconductor device of 1.0×0.5 mm according to a fourth embodiment of the present invention. As illustrated in FIGS. 4A and 4B, in addition to a main stamp such as a produce name of three characters stamped in the main stamp space 32, the outer peripheral portion 30, which is the blank space in the related art, is also stamped as a sub-stamp 35.

The sub-stamp 35 provided on the outer peripheral portion 30 is formed of a geometric-configured pattern such as a dot array pattern, and the sub-stamp 35 is provided on only one of the opposed sides of the package. The sub-stamp 35 is formed of multiple dot array lines.

One of the dot array lines is arranged immediately close to the main stamp space 32, and another dot array line is disposed on the dicing line 34.

In FIGS. 4A and 4B, the sub-stamps 35 are provided on only one of the opposed sides of the package in the vertical direction. It is not limited to above, the same stamps may be provided on one of opposed sides of the package in the horizontal direction.

FIG. 4A is a diagram illustrating a state in which the stamp is not misaligned. In this case, as illustrated in FIG. 4A, after the wafer is singulated by dicing, the sub-stamp 35 appears on the outer peripheral portion 30 immediately below the main stamp space 32.

FIG. 4B is an illustrative diagram when the stamp is misaligned in the vertical direction. As illustrated in FIG. 4B, after the wafer is singulated by dicing, the sub-stamp 35 on the outer peripheral portion 30 on the lower side of the main stamp space 32 may be lost due to the stamp misalignment. However, the sub-stamp 35 of the dot array pattern appears on the outer peripheral portion 30 on an upper side of the main stamp space 32 instead.

In this way, because the sub-stamp 35 appears on the outer peripheral portion 30 on at least one of the opposed sides even if the stamp is misaligned, the sub-stamp 35 on the outer peripheral portion 30 can be identified even if the stamp is misaligned.

Fifth Embodiment

Figure 5B:
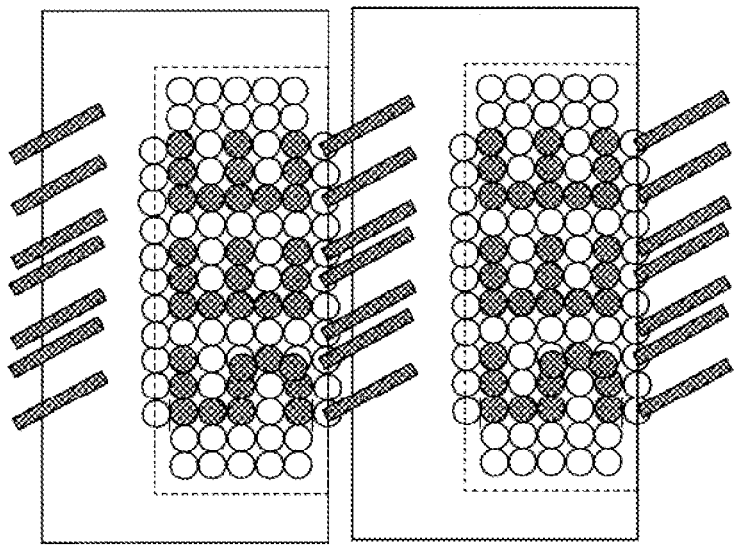
FIGS. 5A and 5B are top views of a wafer level semiconductor package according to a fifth embodiment of the present invention.
Figure 5A:
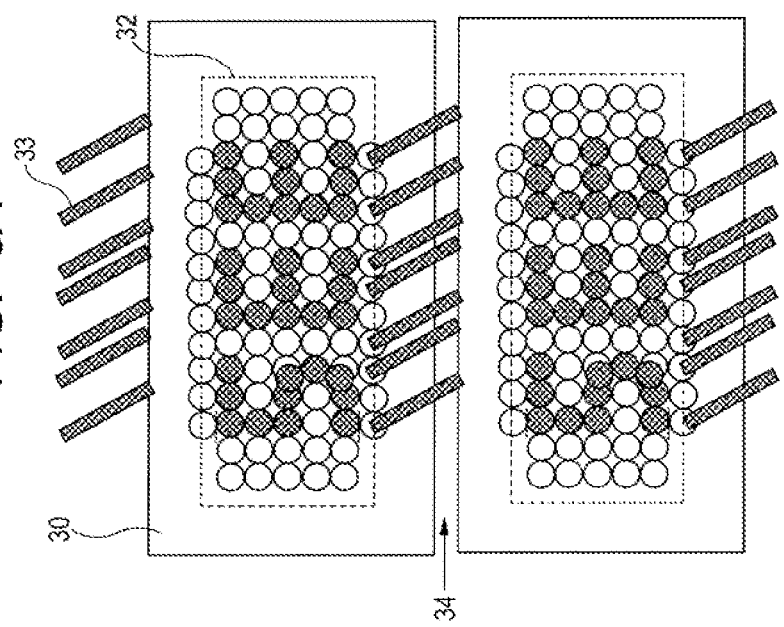
Figure 7A:
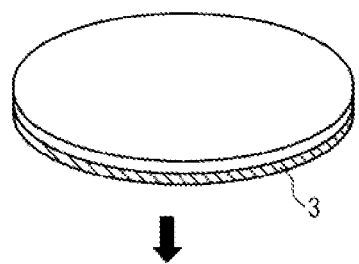
FIGS. 7A to 7E are diagrams of a process of manufacturing a wafer level semiconductor package according to one related art.
Figure 7A:
Figure 7B:
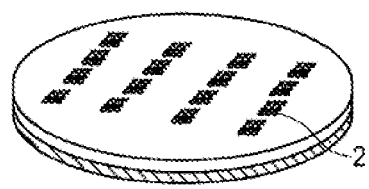
Figure 7B:
Figure 7C:
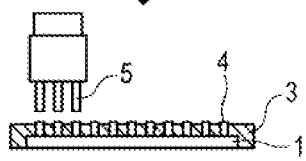
Figure 7C:
Figure 7D:
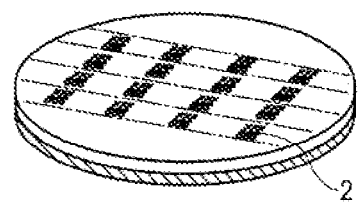
Figure 7D:
Figure 7E:
Figure 8A:
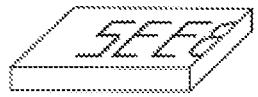
FIGS. 8A to 8D are illustrative diagrams of stamp misalignment according to the related art.
Figure 8B:
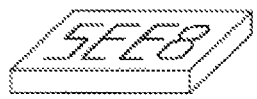
Figure 8C:
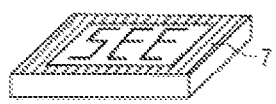
Figure 8D:
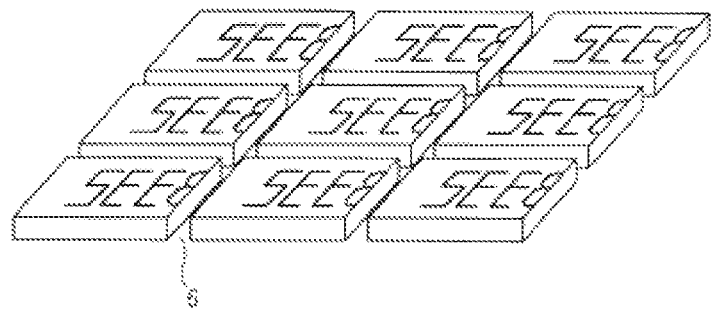
Figure 9:
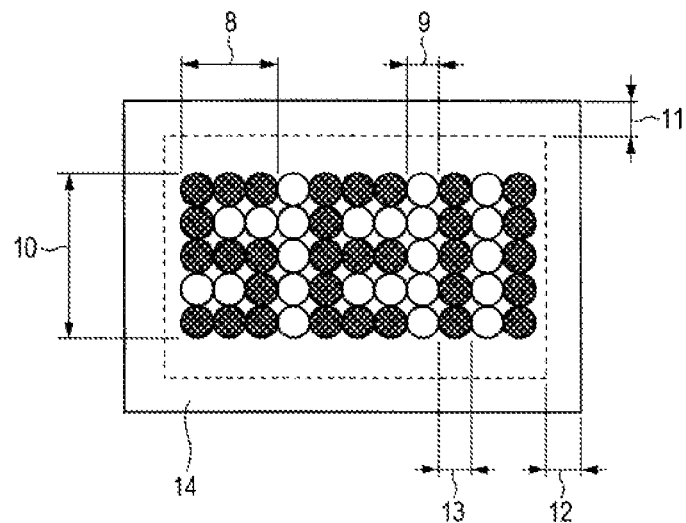
FIG. 9 is an illustrative diagram of a stamp position and a blank space according to the related art.
Figure 10:
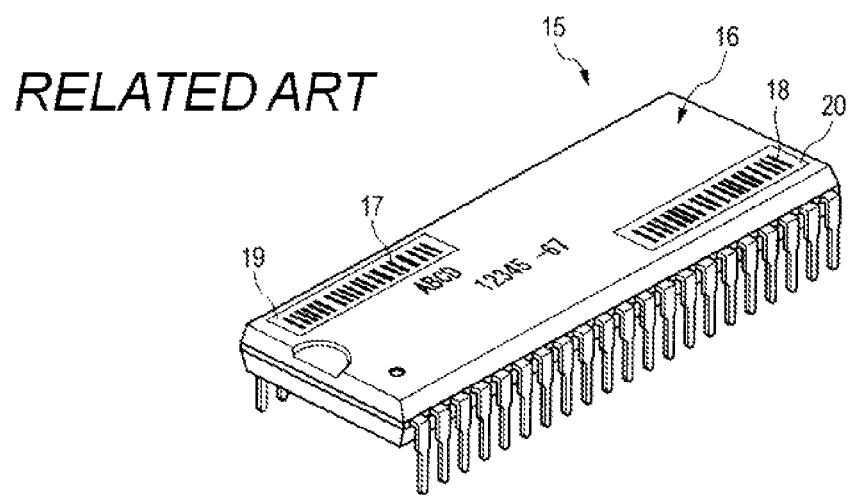
FIG. 10 is a perspective view of a semiconductor package according to another related art.

FIGS. 5A and 5B are top views of a downsized wafer level semiconductor device of 1.0×0.5 mm according to a fifth embodiment of the present invention. As illustrated in FIGS. 5A and 5B, in addition to a main stamp such as a produce name of three characters stamped in the main stamp space 32, the outer peripheral portion 30, which is the blank space in the related art, is also stamped as a sub-stamp 33.

The sub-stamp 33 provided on the outer peripheral portion 30 is formed of a geometric-configured pattern such as an oblique bar code pattern, and extends up to the dicing line 34. Thus, the sub-stamp 33 is provided on one of the opposed sides of the package.

In FIGS. 5A and 5B, the sub-stamps 33 are provided on only the opposed sides of the package in the vertical direction. It is not limited to above, the same sub-stamps 33 may be provided on opposed sides of the package in a horizontal direction.

FIG. 5A is a diagram illustrating a state in which the stamp is not misaligned. In this case, as illustrated in FIG. 5A, the sub-stamp 33 is stamped on only the outer peripheral portion 30 on the lower side of the main stamp space 32. Therefore, the sub-stamp 33 on the lower outer peripheral portions 30 is extended to an edge of the package.

FIG. 5B is an illustrative diagram when the stamp is misaligned in the vertical direction. As illustrated in FIG. 5B, after the wafer is singulated by dicing, the sub-stamp 33 on the outer peripheral portion 30 on the lower side of the main stamp space 32 may be lost due to the stamp misalignment. However, another sub-stamp 33 located at upper side appears on the outer peripheral portion 30 on an upper side of the main stamp space 32 instead. In this case, the sub-stamp 33 on the upper outer peripheral portion 30 is extended to an edge of the package.

In this way, because the sub-stamp 33 appears on the outer peripheral portion 30 on at least one of the opposed sides of the package even if the stamp is misaligned, the sub-stamp 33 on the outer peripheral portion 30 can be identified even if the stamp is misaligned.

In the future, with the downsized semiconductor package, the region to be stamped is reduced, and the stampable region tends to be increasingly reduced.

On the other hand, packaging changes from packaging mainly including a postprocess using a lead frame or a substrate to packaging mainly including a preprocess such as a wafer level semiconductor package. With this change, the traceability information of the manufacture quality management changes from a production lot unit of the postprocess to a production lot unit of the preprocess, and the required amount of information tends to increase.

The solution of the above conflicting problems is a purpose of the present invention.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor package having a stamp, comprising:
   a terminal formed on a first surface of the semiconductor package; and
   a stamp provided on a second surface of the semiconductor package, the second surface located on a flip side to the first surface,
   wherein the stamp comprises
      a main stamp comprising a character pattern identifiable as one or more alphanumeric characters,
      a first sub-stamp having an array pattern, the array pattern comprising one of a plurality of stripes and a plurality of dots, and
      a second sub-stamp having a same array pattern as the array pattern of the first sub-stamp,
   wherein the main stamp is sandwiched between the first sub-stamp and the second sub-stamp.

2. The semiconductor package according to claim 1, wherein each of the plurality of stripes in the first sub-stamp is extended to a first edge of the second surface, and each of the plurality of stripes in the second sub-stamp is extended to a second edge of the second surface, the second edge being opposite to the first edge.

3. The semiconductor package according to claim 2, wherein the array pattern is an oblique pattern.

4. The semiconductor package according to claim 1, wherein the second surface is a grinding surface.

* * * * *